US008962397B2

(12) United States Patent
Dix et al.

(10) Patent No.: US 8,962,397 B2
(45) Date of Patent: Feb. 24, 2015

(54) MULTIPLE WELL DRAIN ENGINEERING FOR HV MOS DEVICES

(75) Inventors: Gregory Dix, Tempe, AZ (US); Leighton E. McKeen, Gilbert, AZ (US); Ian Livingston, Chandler, AZ (US); Roger Melcher, Gilbert, AZ (US); Rohan Braithwaite, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 335 days.

(21) Appl. No.: 13/554,890

(22) Filed: Jul. 20, 2012

(65) Prior Publication Data

US 2013/0026545 A1 Jan. 31, 2013

Related U.S. Application Data

(60) Provisional application No. 61/511,195, filed on Jul. 25, 2011.

(51) Int. Cl.
| *H01L 21/332* | (2006.01) |
| *H01L 21/335* | (2006.01) |
| *H01L 21/00* | (2006.01) |
| *H01L 21/8238* | (2006.01) |
| *H01L 21/336* | (2006.01) |
| *H01L 29/78* | (2006.01) |
| *H01L 23/544* | (2006.01) |
| *H01L 29/66* | (2006.01) |
| *H01L 29/08* | (2006.01) |
| *H01L 29/423* | (2006.01) |

(52) U.S. Cl.
CPC .......... *H01L 29/7816* (2013.01); *H01L 23/544* (2013.01); *H01L 29/66659* (2013.01); *H01L 29/66681* (2013.01); *H01L 29/7835* (2013.01); *H01L 29/0847* (2013.01); *H01L 29/0878* (2013.01); *H01L 29/42368* (2013.01); *H01L 2223/54426* (2013.01); *H01L 2223/54453* (2013.01)
USPC ........... 438/135; 438/142; 438/153; 438/188; 438/228; 438/282; 257/E21.382; 257/E21.345; 257/E21.417

(58) Field of Classification Search
USPC ......... 438/135, 142, 153, 154, 188, 228, 282; 257/E21.382, E21.345, E21.417
See application file for complete search history.

(56) References Cited

U.S. PATENT DOCUMENTS

| 5,811,850 | A | 9/1998 | Smayling et al. | ............. 257/335 |
| 8,592,905 | B2 * | 11/2013 | Pu et al. | ......................... 257/343 |
| 8,643,101 | B2 * | 2/2014 | Kao et al. | ....................... 257/339 |

FOREIGN PATENT DOCUMENTS

| EP | 0964454 A1 | 12/1999 | ............ H01L 21/336 |
| JP | 2004200359 A | 7/2004 | ............ H01L 21/336 |

OTHER PUBLICATIONS

International Search Report and Written Opinion, Application No. PCT/US2012/047826, 14 pages, Apr. 3, 2013.

* cited by examiner

*Primary Examiner* — Mohsen Ahmadi
(74) *Attorney, Agent, or Firm* — King & Spalding L.L.P.

(57) ABSTRACT

At least one N-well implant having a different doping level is formed in a silicon substrate by first etching the substrate with an alignment target for aligning future process masks thereto. This alignment target is outside of any active device area. By using at least one N-well implant having a different doping level in combination with the substrate, a graded junction in the drift area of a metal oxide semiconductor (MOS) field effect transistor (FET) can be created and a pseudo Ldd structure may be realized thereby.

21 Claims, 6 Drawing Sheets (a)

(b)

(c)

MULTIPLE WELL DRAIN ENGINEERING FOR HV MOS DEVICES

RELATED PATENT APPLICATION

This application claims priority to commonly owned U.S. Provisional Patent Application Ser. No. 61/511,195; filed Jul. 25, 2011; entitled "Multiple Well Drain Engineering for HV MOS Devices," by Greg Dix, Leighton E. McKeen, Ian Livingston, Roger Melcher and Rohan Braithwaite; which is hereby incorporated by reference herein for all purposes.

TECHNICAL FIELD

The present disclosure relates to fabrication of high voltage (HV) metal oxide semiconductor (MOS) devices, and more particularly, to fabrication of multiple well drains in the HV MOS devices.

BACKGROUND

High voltage (HV) metal oxide semiconductor (MOS) devices typically use well implants to create the drain and drift structures. Hot carrier impact ionization limits the voltage range of these devices, and typical lightly doped drain (Ldd) implants are not useful in drain engineering as the drain is under the field oxide. Typical prior technology self aligned well structures create undesirable steps (change in elevation) at the well edges in the silicon (Si) substrate surface and cause alignment issues for successive well implants.

Referring to FIG. 1, depicted are schematic elevational diagrams of prior art process steps used to form an n-well implant in a p-substrate. FIG. 1(a) represents a schematic elevational diagram of the n-well implant 104 in a P-substrate 102 that is masked by a nitride layer 106. FIG. 1(b) represents an oxide layer 108 grown over the n-well implant 104 then the nitride layer 106 is stripped therefrom. FIG. 1(c) represents the N-well implant 104a in the P-substrate 102 after the oxide layer 108 is etched off. The oxide growth consumes an amount of the oxide layer 108 causing some of the top portion of the N-well implant 104 to be removed, thereby resulting in steps formed at the N-well edges 110. These n-well edges 110 (steps) are used for subsequent mask alignment purposes.

SUMMARY

Therefore, what is needed is the ability to incorporate drain engineering in the drift region underneath the polysilicon gate and or field oxide to obtain a more robust HV MOS device. Use of differently doped well implants facilitates drain engineering.

According to an embodiment, a method for fabricating a high voltage (HV) metal oxide semiconductor (MOS) field effect transistor (FET) device may comprise the steps of: forming a zero layer (222) on a P-substrate (202) by etching an alignment target (220) on a surface of the P-substrate (202) and outside of active device areas of the P-substrate (202); forming a lightly doped N-well (204a) in a portion of the P-substrate (202) by implant; forming a doped N-well (204b) in a portion of the lightly doped N-well (204a) by implant; forming field oxides (214) over certain portions of the P-substrate (202); forming a gate oxide (216) over a portion of the lightly doped N-well (204a) and a portion of the P-substrate (202); forming a polysilicon gate (218) over the gate oxide (216); and forming a heavily doped N+ region (204c) in a portion of the doped N-well (204b) and another heavily doped N+ region (212) in another portion of the P-substrate (202) by implant.

According to a further embodiment of the method, the steps of forming may comprise using masks aligned with the alignment target (220). According to a further embodiment of the method, a drain connection may be made to the heavily doped N+ region (204c), a gate connection may be made to the polysilicon gate (218), and a source connection may be made to the another heavily doped N+ region (212). According to a further embodiment of the method, a plurality of HV MOSFET devices may be formed. According to a further embodiment of the method, the lightly doped N-well (204a) and doped N-well (204b) may form a graded junction in a drift area of the MOSFET device. According to a further embodiment of the method, the steps of adjusting lengths of the lightly doped and doped N-wells (204a and 204b) may be used to reduce high field effects of the MOSFET device. According to a further embodiment of the method, the steps of adjusting lengths of the lightly doped and doped N-wells (204a and 204b) may be used to reduce on resistance of the MOSFET device.

According to another embodiment, a high voltage (HV) metal oxide semiconductor (MOS) field effect transistor (FET) device may comprise: a zero layer (222) on a P-substrate (202) having an etched alignment target on a surface thereof and outside of active device areas of the P-substrate (202); a lightly doped N-well (204a) implanted in a portion of the P-substrate; a doped N-well (204b) implanted in a portion of the lightly doped N-well (204a); a heavily doped N+ region (204c) implanted in a portion of the doped N-well (204b); another heavily doped N+ region (212) implanted in another portion of the P-substrate (202); field oxides (214) formed adjacent to the heavily doped N+ region (204c) and the another heavily doped N+ region (212); a gate oxide (216) formed over a portion of the lightly doped N-well (204a) and adjacent to the another heavily doped N+ region (212); and a polysilicon gate (218) formed over the gate oxide (216).

According to a further embodiment, the alignment target (220) may be used for aligning implantation of the lightly doped N-well (204a), the doped N-well (204b), the heavily doped N+ region (204c), the another heavily doped N+ region (212), the field oxides (214), the gate oxide (216), and the polysilicon gate (218). According to a further embodiment, a drain connection may be made to the heavily doped N+ region (204c), a gate connection may be made to the polysilicon gate (218), and a source connection may be made to the another heavily doped N+ region (212). According to a further embodiment, a plurality of high voltage metal oxide semiconductor field effect transistor devices may be formed. According to a further embodiment, the lightly doped N-well (204a) and doped N-well (204b) may form a graded junction in a drift area of the MOSFET device. According to a further embodiment, lengths of the lightly doped (204a) and doped N-wells (204b) may be adjusted to reduce high field effects of the MOSFET device. According to a further embodiment, lengths of the lightly doped N-well (204a) and the doped N-well (204b) may be adjusted to reduce on resistance of the MOSFET device.

According to yet another embodiment, a method for fabricating a high voltage (HV) metal oxide semiconductor (MOS) field effect transistor (FET) device may comprise the steps of: forming a zero layer (422) on a lightly doped N⁻-substrate (402) by etching an alignment target (420) on a surface of the lightly doped N⁻-substrate (402) and outside of active device areas of the lightly doped N⁻-substrate (402); forming an N-well (404a) in a portion of the lightly doped N⁻-substrate (402) by implant, wherein the N-well (404a) may be more heavily doped than the lightly doped N⁻-substrate (402); forming field oxides (414) over certain portions of the lightly doped N⁻-substrate (402); forming a gate oxide (416) over portions of the lightly doped N⁻-substrate (402); forming a polysilicon gate (418) over the gate oxide (416); forming a P-type region (424) in a portion of the lightly doped N⁻-substrate (402) by implant; forming a heavily doped N+ region (404b) in a portion of the N-well (404a) and another heavily doped N+ region (412) in a portion of the P-type region (424) by implant; and forming a heavily doped P+ region (426) in a portion of the P-type region (424) by implant.

According to a further embodiment of the method, the steps of forming may comprise using masks aligned with the alignment target (420). According to a further embodiment of the method, a drain connection may be made to the heavily doped N+ region (404b), a gate connection may be made to the polysilicon gate (418), and a source connection may be made to the another heavily doped N+ region (412). According to a further embodiment of the method, a plurality of HV MOSFET devices may be formed. According to a further embodiment of the method, the N-well (404a) and lightly doped N⁻-substrate (402) may form a graded junction in a drift area of the MOSFET device. According to a further embodiment of the method, the step of adjusting a length of the N-well (404a) may be used to reduce high field effects of the MOSFET device. According to a further embodiment of the method, the step of adjusting a length of the N-well (404a) may be used to reduce on resistance of the MOSFET device.

According to still another embodiment, a high voltage (HV) metal oxide semiconductor (MOS) field effect transistor (FET) device may comprise: a zero layer (422) on a lightly doped N⁻-substrate (402) having an etched alignment target (420) on a surface of the lightly doped N⁻-substrate (402) and outside of active device areas of the lightly doped N⁻-substrate (402); an N-well (404a) implanted in a portion of the lightly doped N⁻-substrate (402), wherein the N-well (404a) may be more heavily doped than the lightly doped N⁻-substrate (402); a P-type region (424) implanted in a portion of the lightly doped N⁻-substrate (402); a heavily doped N+ region (404b) implanted in a portion of the N-well (404a); another heavily doped N+ region (412) implanted in a portion of the P-type region (424); a heavily doped P+ region (426) implanted in a portion of the P-type region (424); field oxides (414) adjacent to the heavily doped N+ region (404b) and the heavily doped P+ region (426); a gate oxide (416) formed over portions of the lightly doped N⁻-substrate (402) and the P-type region (424); and a polysilicon gate (418) formed over the gate oxide (416).

According to a further embodiment, wherein the alignment target may be used for aligning implantation of the N-well (404a), the P-type region (424), the heavily doped N+ region (404b), the another heavily doped N+ region (412), the heavily doped P+ region (426), the field oxides (414), the gate oxide (416), and the polysilicon gate (418). According to a further embodiment, a drain connection may be made to the heavily doped P+ region (404b), a gate connection may be made to the polysilicon gate (418), and a source connection may be made to the another heavily doped P+ region (412). According to a further embodiment, a plurality of high voltage metal oxide semiconductor field effect transistor devices may be formed. According to a further embodiment, the N-well (404a) and lightly doped N⁻-substrate (402) may form a graded junction in a drift area of the MOSFET device. According to a further embodiment, a length of the N-well (404a) may be adjusted to reduce high field effects of the MOSFET device. According to a further embodiment, a length of the N-well (404a) may be adjusted to reduce on resistance of the MOSFET device. According to a further embodiment, the another heavily doped N+ region (412) and the heavily doped P+ region (426) may be butted together, and the heavily doped P+ region (426) may be connected to the source connection. According to a further embodiment, the another heavily doped N+ region (412) and the heavily doped P+ region (426) may be spaced apart, and the heavily doped P+ region (426) may be connected to a voltage for adjusting a voltage potential of the P-type region (424).

BRIEF DESCRIPTION OF THE DRAWINGS

A more complete understanding of the present disclosure may be acquired by referring to the following description taken in conjunction with the accompanying drawings wherein.

Figure 1:
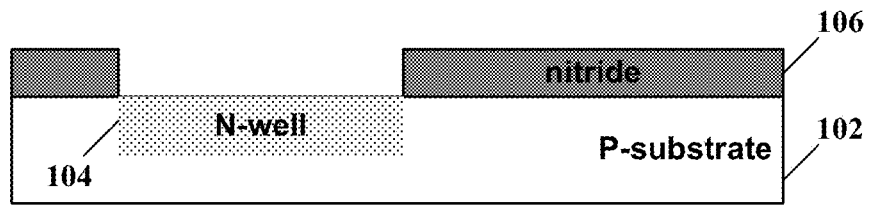
FIG. 1 illustrates schematic elevational diagrams of prior art process fabrication steps used to form an n-well implant in a p-substrate.
Figure 1:
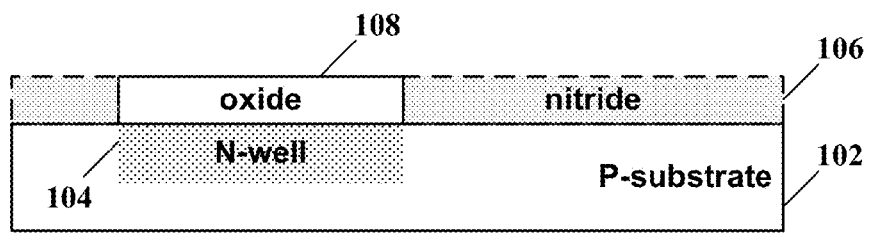
Figure 1:
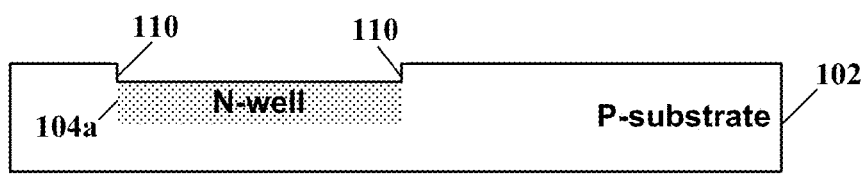

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

By using differently doped well implants a graded N-well junction can be created under the field oxide. Multiple N-well implants are formed in a P-substrate or a single N-well implant is formed in a lightly doped N-substrate by first etching the silicon substrate with an alignment target for aligning future process masks thereto. The alignment target is outside of any active device area. By using N-well implants of different doping levels a graded junction in the drift area of a metal oxide semiconductor (MOS) field effect transistor (FET) can be created and a pseudo Ldd structure may thereby be realized. By fine tuning the lengths of the heavier and lighter doped N-well implants, high field effects can be significantly reduced as well as a reduction in the on resistance of the HV MOS FET device.

Referring now to the drawings, the details of a specific example embodiment is schematically illustrated. Like elements in the drawings will be represented by like numbers, and similar elements will be represented by like numbers with a different lower case letter suffix.

Figure 2:
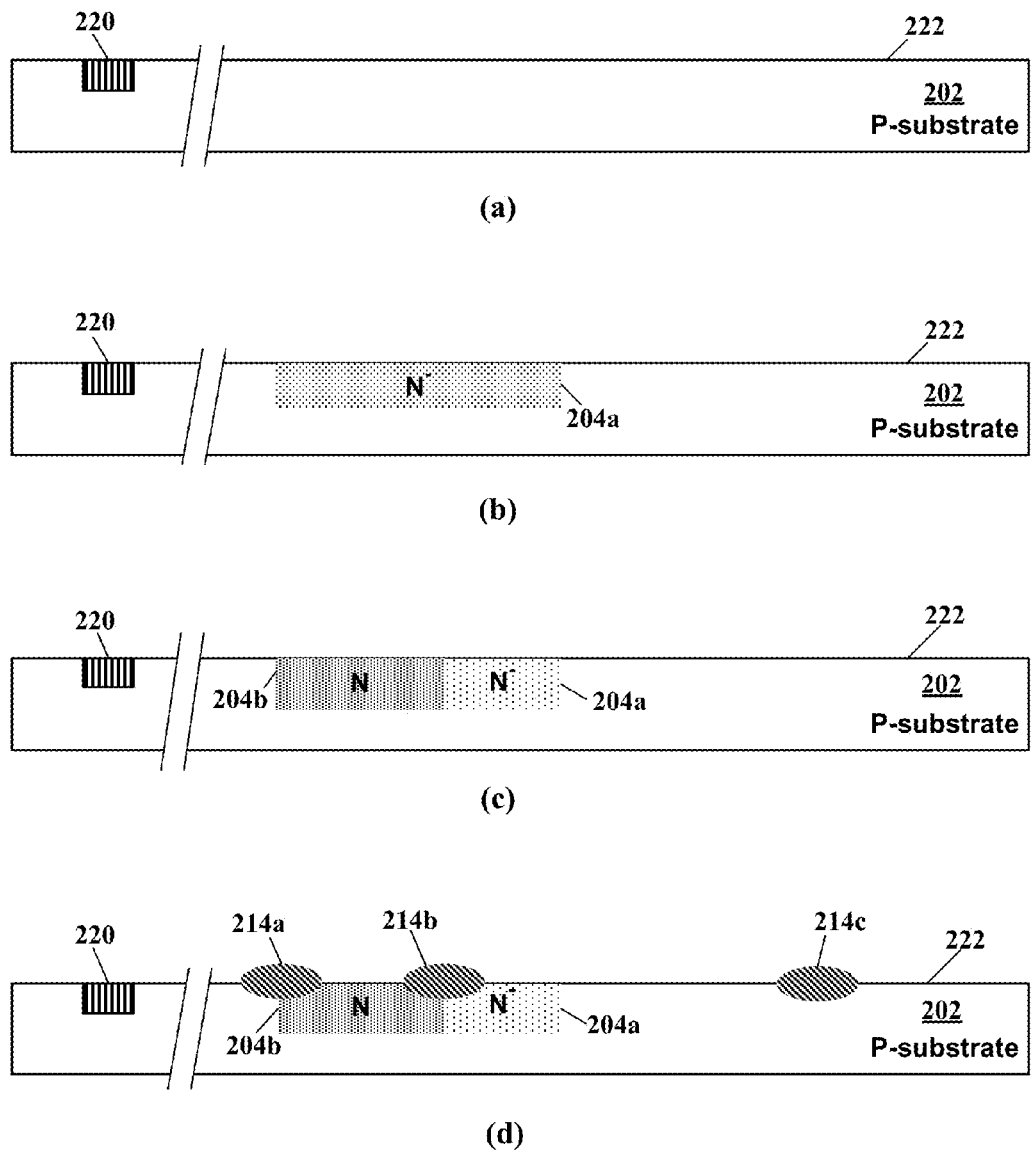
FIGS. 2 and 2A illustrate schematic elevational diagrams of process fabrication steps used in forming multiple N-well implants in a P-substrate, according to a specific example embodiment of this disclosure.
Figure 2A:
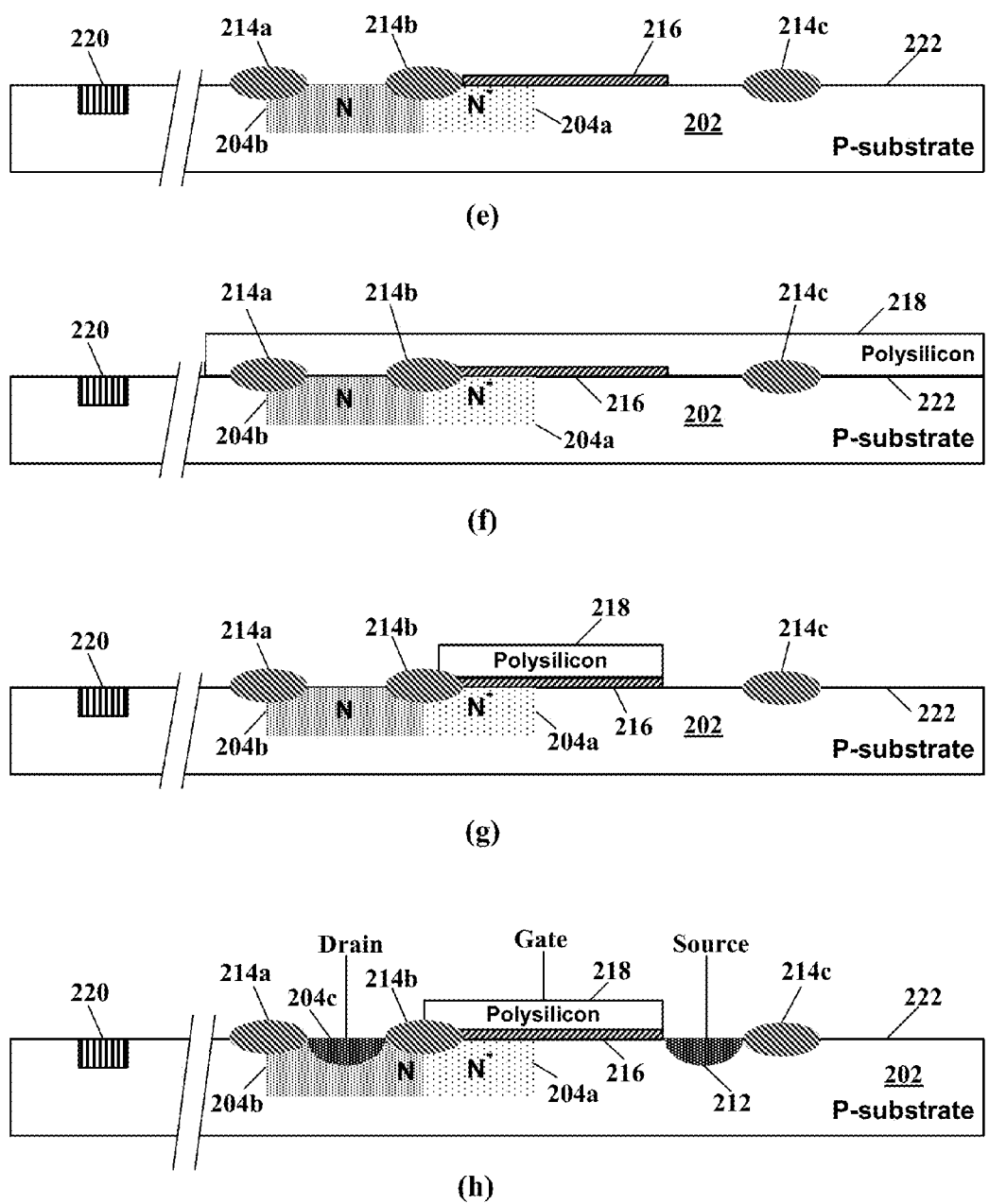

Referring to FIGS. 2 and 2A, depicted are schematic elevational diagrams of process fabrication steps used in forming multiple N-well implants in a P-substrate, according to a specific example embodiment of this disclosure. Shown in FIG. 2(a) a "zero" layer 222 is created by etching the silicon P-substrate 202 with an alignment target 220 for aligning future masks thereto. The alignment target 220 is outside of any active device area. Thereafter multiple implants may be performed as more fully described hereinafter. By using multiple well implants of different doping levels a graded junction in the drift area of a metal oxide semiconductor (MOS) field effect transistor (FET) can be created and a pseudo Ldd structure may thereby be realized.

Shown in FIG. 2(b) a lightly doped $N^-$-well 204a is formed through means, e.g., implant and drive (heat), that are well known to one having ordinary skill in integrated circuit semiconductor fabrication. Shown in FIG. 2(c) a second more heavily doped N-well 204b is formed through well known means, e.g., implant and drive (heat). Shown in FIG. 2(d) field oxides 214a, 214b and 214c are grown (formed) through well known means. Shown in FIG. 2(e) a gate oxide 216 is grown (formed) through well known means. Shown in FIG. 2(f) polysilicon 218 is grown (formed) over the gate oxide 216 through well known means. Shown in FIG. 2(g) the polysilicon 218 is formed into a polysilicon gate 218 by, for example but not limited to, photolithography and etching over the gate oxide 216 through well known means. Shown in FIG. 2(h) heavily doped $N^+$ regions 204c and 212 are formed through well known means, e.g., implant and drive (heat), for drain and source connections, respectively. It is contemplated and with the scope of this disclosure that the wells can be implanted after the field oxide/isolation is in place, and the wells can be implanted and dopants activated without a drive (heat).

The aforementioned fabrication steps create a high voltage (HV) MOS FET shown in FIG. 2(h). For each of the aforementioned steps, the alignment target 220 is used to align the respective masks thereof. The multiple N-well implants 204 create a graded junction in a drift area of the HV MOS FET. By fine tuning the lengths of the heavy and light N-well implants, high field effects can be significantly reduced as well as a reduction in the on resistance of the HV MOS FET device.

Figure 3:
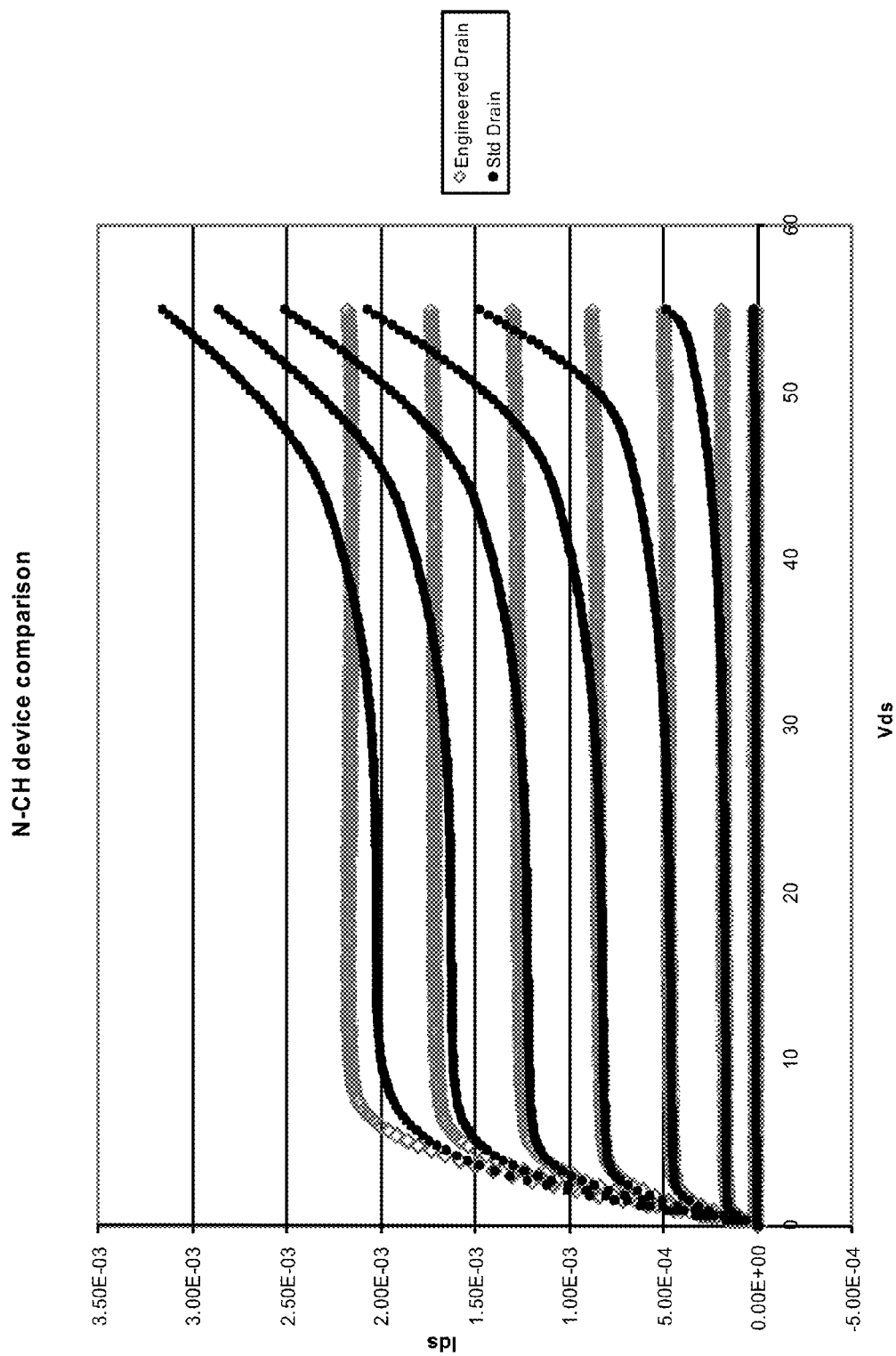
FIG. 3 illustrates a voltage-current graph of Vds and Ids showing an improvement of the drive current in the HV MOS device with the multiple N-well drain engineering, according to the teachings of this disclosure.

Referring to FIG. 3, depicted is a voltage-current graph of Vds and Ids showing an improvement of the drive current in the HV MOS FET device with the multiple N-well drain engineering, according to the teachings of this disclosure. Advantages of the present invention are: 1) More accurate alignment of well implants, 2) ability to use multiple well implants to generate an engineered drift/drain, 3) better drive current, 4) elimination of hot carrier affects, and 5) a wider voltage range of device operation.

Figure 4:
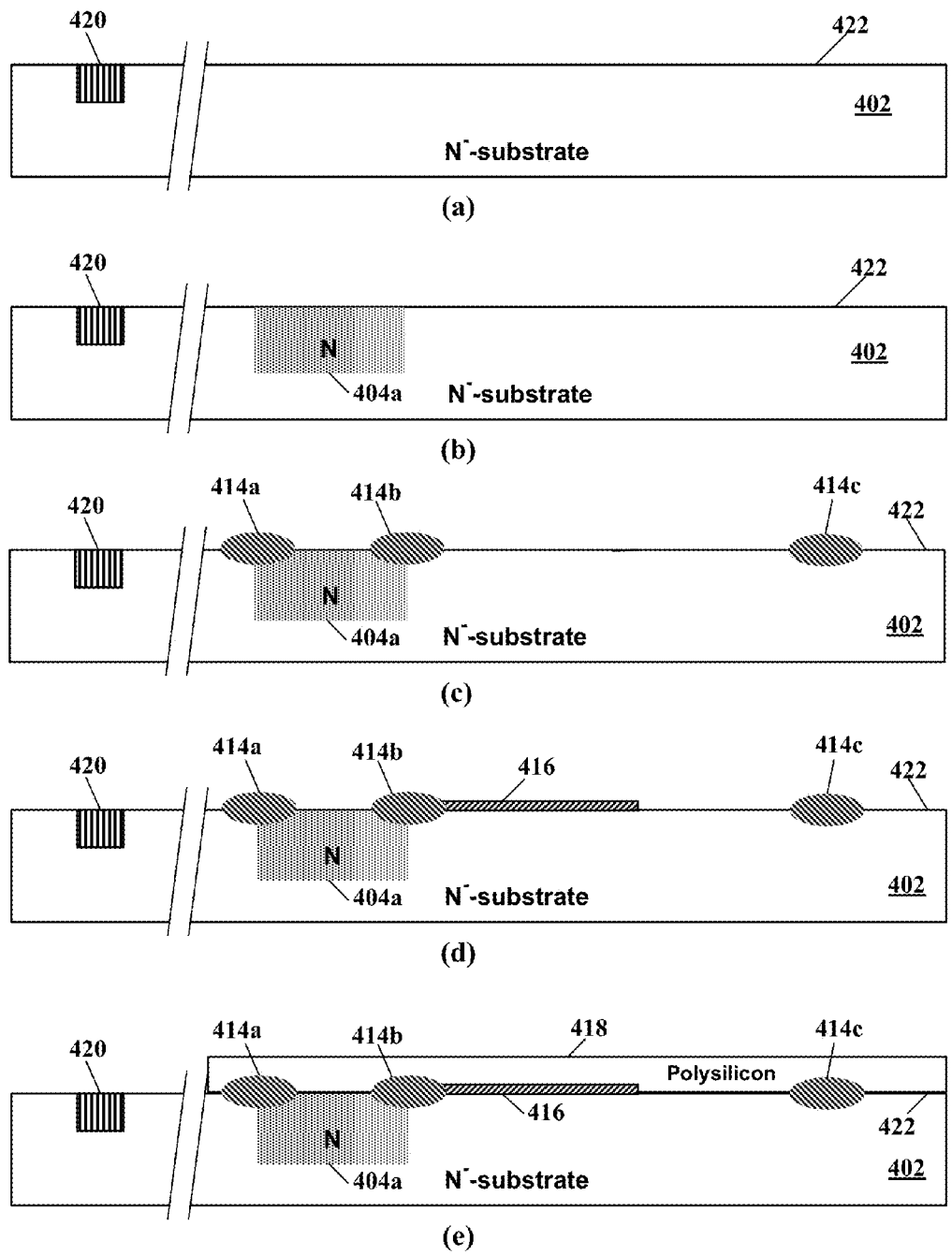
FIGS. 4 and 4A illustrate schematic elevational diagrams of process fabrication steps used in forming N-well implants and a lightly doped P-well implant in an N⁻-substrate, according to another specific example embodiment of this disclosure.
Figure 4A:
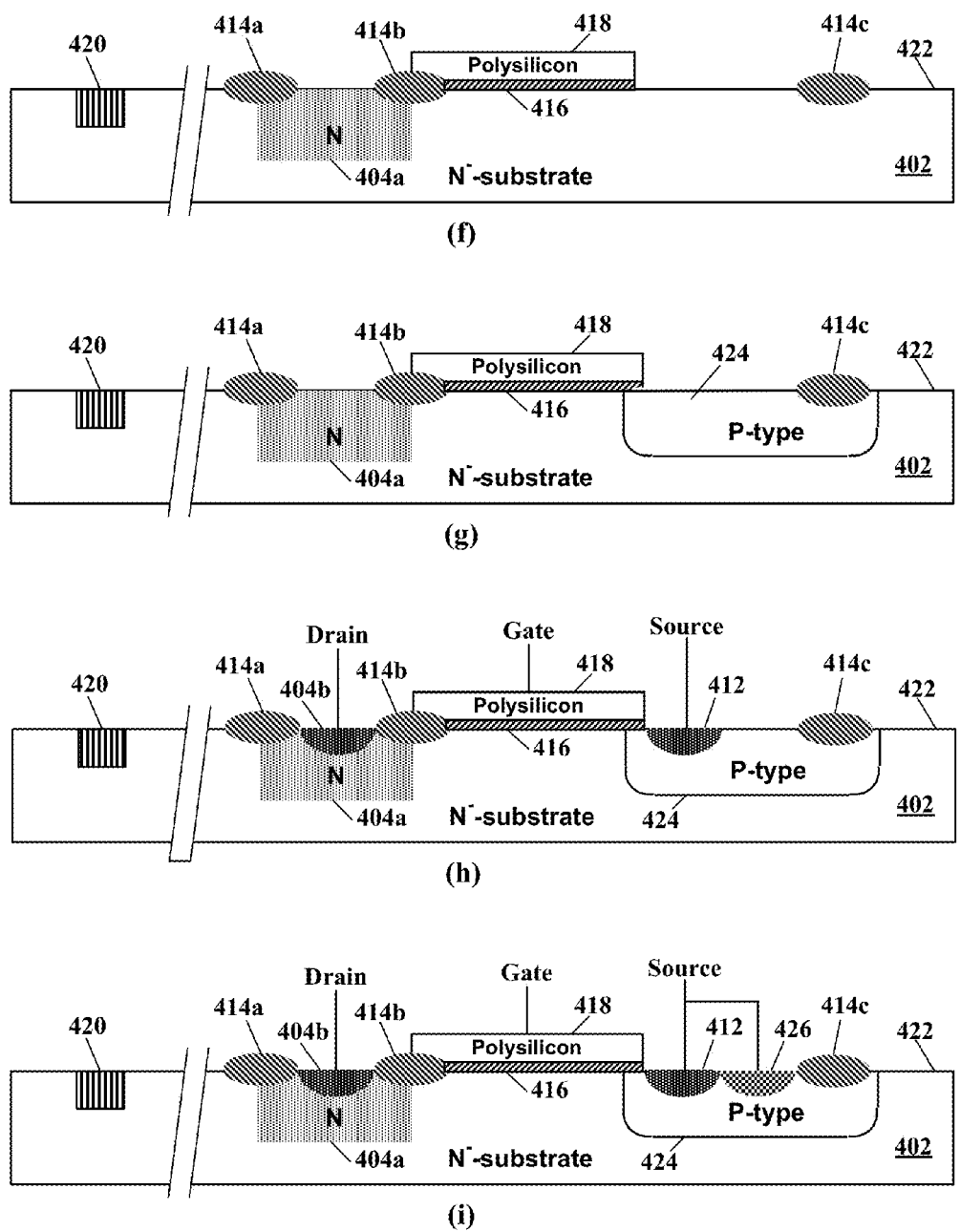

Referring to FIGS. 4 and 4A, depicted are schematic elevational diagrams of process fabrication steps used in forming N-well implants and a lightly doped P-well implant in an $N^-$-substrate, according to another specific example embodiment of this disclosure. Shown in FIG. 4(a) a "zero" layer 422 is created by etching a lightly doped $N^-$-substrate 402 with an alignment target 420 for aligning future masks thereto. The alignment target 420 is outside of any active device area. Thereafter multiple implants may be performed as more fully described hereinafter. By using a N-well 402a of a different doping level then the lightly doped $N^-$-substrate 402, a graded junction in the drift area of a metal oxide semiconductor (MOS) field effect transistor (FET) can be created and a pseudo Ldd structure may thereby be realized.

Shown in FIG. 4(b) a more heavily doped N-well 404a is formed in the lightly doped $N^-$-substrate 402 through well known means, e.g., implant and drive (heat). Shown in FIG. 4(c) field oxides 414a, 414b and 414c are grown (formed) through well known means. Shown in FIG. 4(d) a gate oxide 416 is grown (formed) through well known means. Shown in FIG. 4(e) polysilicon 418 is grown (formed) over the gate oxide 416 through well known means. Shown in FIG. 4(f) the polysilicon 418 is formed into a polysilicon gate 418 by, for example but not limited to, photolithography and etching over the gate oxide 416 through well known means.

Shown in FIG. 4(g) a low concentration implant P-type region 424 is formed in the lightly doped $N^-$-substrate 402 through well known means e.g., photo, implant and drive (heat). The P-type region 424 may also be formed without requiring a drive (heat) for certain implant conditions. Shown in FIG. 4(h) heavily doped $N^+$ regions 404b and 412 are formed in the N-well 404a and the P-type well 424, respectively, through well known implant means, for drain and source connections, respectively. Shown in FIG. 4(i) a heavily doped $P^+$ region 426 is formed in the P-type region 424 through well known implant means.

The heavily doped $P^+$ region 426 is used as a connection to the P-type region 424. The heavily doped $P^+$ region 426 may be butted adjacent the heavily doped $N^+$ region 412 and also connected to the source contact (as shown in FIG. 4A), or separated from the heavily doped $N^+$ region 412 and connected to a voltage source (not shown) to change the potential of the P-type region 424. For each of the aforementioned steps, the alignment target 420 is used to align the respective masks thereof. The N-well implant 404a and the lightly doped $N^-$-substrate 402 create a graded junction in a drift area of the HV MOS FET. By fine tuning the length of the N-well implant 404a, high field effects can be significantly reduced as well as a reduction in the on resistance of the HV MOS FET device.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for fabricating a high voltage (HV) metal oxide semiconductor (MOS) field effect transistor (FET) device, said method comprising the steps of:

forming a zero layer (222) on a P-substrate (202) by etching an alignment target (220) on a surface of the P-substrate (202) and outside of active device areas of the P-substrate (202);

forming a lightly doped N-well (204a) in a portion of the P-substrate (202) by implant;

forming a doped N-well (204b) in a portion of the lightly doped N-well (204a) by implant;

forming field oxides (214) over certain portions of the P-substrate (202);

forming a gate oxide (216) over a portion of the lightly doped N-well (204a) and a portion of the P-substrate (202);

forming a polysilicon gate (218) over the gate oxide (216);

forming a heavily doped $N^+$ region (204c) in a portion of the doped N-well (204b) and another heavily doped $N^+$ region (212) in another portion of the P-substrate (202) by implant; and adjusting lengths of the lightly doped arid doped N-wells (204a and 204b) to reduce high field effects of the MOSFET device.

2. The method according to claim wherein the steps of forming comprise using masks aligned with the alignment target (220).

3. The method according to claim 1, wherein a drain connection is made to the heavily doped N⁺ region (204c), a gate connection is made to the polysilicon gate (218), and a source connection is made to the another heavily doped N⁺ region (212).

4. The method according to claim 1, wherein a plurality of HV MOSFET devices are formed.

5. The method according to claim 1, wherein the lightly doped N-well (204a) and doped N-well (204b) form a graded junction in a drift area of the MOSFET device.

6. The method according to claim 1, further comprising the steps of adjusting lengths of the lightly doped and doped N-wells (204a and 204b) to reduce on resistance of the MOSFET device.

7. A method for fabricating a high voltage (HV) metal oxide semiconductor (MOS) field effect transistor (FET) device, said method comprising the steps of:
  forming a zero layer (422) on a lightly doped N⁺-substrate (402) by etching an alignment target (420) on a surface of the lightly doped N⁺-substrate (402) and outside of active device areas of the lightly doped N+-substrate (402);
  forming an N-well (404a) in a portion of the lightly doped N⁺-substrate (402) by implant, wherein the N-well (404a) is more heavily doped than the lightly doped N+-substrate (402);
  forming field oxides (414) over certain portions of the lightly doped N⁺-substrate (402);
  forming a gate oxide (416) over a portions of the lightly doped N⁺-substrate (402);
  forming a polysilicon gate (418) over the gate oxide (416);
  forming a P-type region (424) in a portion of the lightly doped N⁺-substrate (402) by implant;
  forming a heavily doped N⁺ region (404b) in a portion of the N-well (404a) and another heavily doped N⁺ region (412) in a portion of the P-type region (424) by implant;
  forming a heavily doped P+ region (426) in a portion of the P-type region (424) by implant; and
  adjusting a length of the N-well (404a) to reduce high field effects of the MOSFET device.

8. The method according to claim 7, wherein the steps of forming comprise using masks aligned with the alignment target (420).

9. The method according to claim 7, wherein a drain connection is made to the heavily doped N⁺ region (404b), a gate connection is made to the polysilicon gate (418), and a source connection is made to the another heavily doped N⁺ region (412).

10. The method according to claim 7, wherein a plurality of HV MOSFET devices are formed.

11. The method according to claim 7, wherein the N-well (404a) and lightly doped N⁻-substrate (402) form a graded junction in a drift area of the MOSFET device.

12. The method according to claim 7, further comprising the step of adjusting a length of the N-well (404a) to reduce on resistance of the MOSFET device.

13. A method for fabricating a high voltage (HV) metal oxide semiconductor (MOS) field effect transistor (FET) device, said method comprising the steps of:
  forming a zero layer on a P-substrate by etching an alignment target on a surface of the substrate and outside of active device areas of the substrate;
  forming a lightly doped N-well in a portion of the P-substrate by implant;
  forming a doped N-well in a portion of the lightly doped N-well by implant;
  forming field oxides over certain portions of the substrate, wherein at least one field oxide bridges over a junction between the substrate and the N-well;
  forming a gate oxide over portions of the substrate wherein the gate oxide abuts against said at least one field oxide;
  forming a polysilicon gate over the gate oxide;
  forming a source region in a portion of the substrate by implant;
  forming a heavily doped N⁺ region in a portion of the N-well by implant; and
  adjusting lengths of the lightly doped and doped N-wells to reduce high field effects of the MOSFET device.

14. The method according to claim 13, wherein forming the source region comprises:
  forming another heavily doped N+ region in another portion of the P-substrate by implant.

15. The method according to claim 14, wherein the another heavily doped N+ region is located between gate oxide and another field oxide of said field oxides.

16. The method according to claim 13, wherein the polysilicon gate extends over the field oxide that abuts against the gate oxide.

17. The method according to claim 13, wherein the steps of forming comprise using masks aligned with the alignment target.

18. The method according to claim 13, wherein a drain connection is made to the heavily doped N⁺ region, a gate connection is made to the polysilicon gate, and a source connection is made to the source region.

19. The method according to claim 13, wherein a plurality of HV MOSFET devices are formed.

20. The method according to claim 13, wherein the lightly doped N-well and doped N-well form a graded junction in a drift area of the MOSFET device.

21. The method according to claim 13, further comprising the steps of adjusting lengths of the lightly doped and doped N-wells to reduce on resistance of the MOSFET device.

* * * * *